United States Patent [19]

Clem et al.

[11] 4,409,579

[45] Oct. 11, 1983

[54] SUPERCONDUCTING MAGNETIC SHIELDING APPARATUS AND METHOD

[75] Inventor: John R. Clem, Ames Iowa

[73] Assignee: The United States of America as represented by the U.S. Department of Energy, Washington, D.C.

[21] Appl. No.: 396,556

[22] Filed: Jul. 9, 1982

[51] Int. Cl.³ .............................................. H01F 7/22
[52] U.S. Cl. ................................. 335/216; 174/15 CA
[58] Field of Search ............. 335/216, 301; 174/15 R, 174/15 CA, 15 S

[56] References Cited

U.S. PATENT DOCUMENTS

| 3,595,982 | 7/1971 | Kafka | 335/216 X |
| 3,691,491 | 9/1972 | Massar et al. | 335/216 |
| 3,801,942 | 4/1974 | Elsel | 335/216 |

*Primary Examiner*—George Harris
*Attorney, Agent, or Firm*—Bruce R. Mansfield; Paul A. Gottlieb; Richard G. Besha

[57] ABSTRACT

Disclosed is a method and apparatus for providing magnetic shielding around a working volume. The apparatus includes a hollow elongated superconducting shell or cylinder having an elongated low magnetic pinning central portion, and two high magnetic pinning end regions. Transition portions of varying magnetic pinning properties are interposed between the central and end portions. The apparatus further includes a solenoid substantially coextensive with and overlying the superconducting cylinder, so as to be magnetically coupled therewith.

The method includes the steps passing a longitudinally directed current through the superconducting cylinder so as to depin magnetic reservoirs trapped in the cylinder. Next, a circumferentially directed current is passed through the cylinder, while a longitudinally directed current is maintained. Depinned magnetic reservoirs are moved to the end portions of the cylinder, where they are trapped.

19 Claims, 5 Drawing Figures

SUPERCONDUCTING MAGNETIC SHIELDING APPARATUS AND METHOD

CONTRACTUAL ORIGIN OF THE INVENTION

The U.S. Government has rights in this invention pursuant to Contract No. W-7405-ENG-82 between the U.S. Department of Energy and Ames Laboratory.

BACKGROUND OF THE INVENTION

This invention pertains to magnetic shielding arrangements for providing ultra-low magnetic field regions, below $10^{-6}$ gauss. The demand for such regions is increasing. An important example is the development of computers having superconducting memory storage, in which information is stored in bits represented by the presence or absence of tiny localized bundles of magnetic field, each bundle carrying one quantum of magnetic flux $\phi_0 = 2.07 \times 10^{-7}$ gauss-$cm^2$. Such a memory should be cooled slowly through its superconducting transition temperature in a very low magnetic field. Otherwise, the memory would trap a member of unwanted magnetic flux quanta, which would cause computing errors. A memory of area 10 cm $\times$ 10 cm would trap about 500 unwanted flux quanta when cooled in a field of $10^{-6}$ gauss, but none in a field less than $10^{-9}$ gauss.

Conventional mu-metal shields have provided magnetic fields as low as $10^{-6}$ gauss with drifts of the order of $10^{-7}$ gauss/minute, but this appears to be the lower limit of this type of shielding. Other shielding techniques have been provided by nesting a series of thin-walled mu-metal shields. These techniques, however, are limited by the physical limitations of the material used, and provide only modest additional decreases in magnetic field levels. Other arrangements for attaining low magnetic field regions include arrays of Helmholtz coils, with or without feedback circuitry, which create controlled magnetic fields to cancel undesirable detected magnetic fields. Such arrangements have not proven effective in maintaining ultra-low magnetic field regions.

A radically different type of magnetic shield was made possible with the discovery of superconductivity. Because of the truly zero dc resistance of a superconductor, the magnetic field inside a superconducting shield will remain constant under a changing externally applied field, since shielding currents induced in the superconductor do not decay. Since the discovery of superconductivity, several attempts have been made to produce ultra-low magnetic fields within superconducting shielding vessels. With present technology, however, it has not been possible to conveniently reduce the naturally produced ambient magnetic fields to low values over practical working volumes.

Among the various configurations of shielding vessels, cylinders are particularly useful since they allow access to a field-free region from several directions. Although it is recognized that an infinitely long cylinder is capable of reducing an applied magnetic field, a practical cylinder cannot have infinite length. As a consequence, practical cylindrical shields experience a component of applied magnetic field which penetrates the open cylinder ends, decaying exponentially with distance from those ends. The lowest internal fields are therefore expected to be found at the center of a practical cylinder. It has been discovered, however, that ultra-low magnetic fields predicted by theory have not been achieved, even at the center of such cylinders, because of flux quanta that are trapped or pinned in the cylinder wall near the center of the cylinder as the superconductor is cooled through its superconducting transition temperature.

SUMMARY OF THE INVENTION

It is therefore an object of the present invention to provide a means and method for readily removing low level magnetic flux quanta that are trapped in cylindrical superconducting magnetic shields.

It is another object of the present invention to provide a means to prevent nucleation of new magnetic flux quanta at cylinder ends and to further prevent the subsequent inward migration of flux quanta from the cylinder ends into the central region of the cylinder.

Yet another object of the present invention is to provide reservoirs for outwardly directed flux quanta (vortices) and inwardly directed flux quanta (antivortices) in a superconducting magnetic shield, such that the reservoirs enable the achievement of a final state of the magnetic shield in which no longitudinal magnetic flux quanta thread through the space internal to the central region of the superconducting cylindrical shell.

These and other objects of the present invention are provided by a magnetic shield having a novel superconducting cylindrical shell, which includes an elongated central low magnetic-pinning region disposed between high magnetic-pinning end regions. Transition regions located between the central and end regions of the cylinder provide reservoirs for magnetic vortices and antivortices. A normal-metal or insulating cylinder, concentric and coextensive with the superconducting shell, serves as the mechanical support structure for the superconducting shell. An electrical current is applied to the end regions of the superconducting shell. The current magnitude is chosen to exceed the critical depinning current of the central region of the shell, such that magnetic flux quanta previously trapped in the central region are driven into motion in nearly circular paths around the perimeter of the cylindrical shell. These circular paths comprise either vortex or antivortex paths, present in equal number. All vortex and antivortex paths that intersect with each other result in flux annihilation. Those vortex and antivortex paths that do not intersect each other, however, are subjected to a second magnetomotive force of a longitudinal magnetic field of an outer coaxial solenoid, which is spaced apart from and surrounds the superconducting shell. As a consequence of the Meissner effect, circumferentially directed currents are induced in the superconducting shell wherein the induced current is greater than the critical depinning current of the central region of the superconducting shell. As a result, vortices trapped in the superconducting shell are moved to one transition region, and antivortices in the superconducting shell are moved to the opposite transition region. The magnetic field of the coaxial solenoid also can be reversed, causing vortices and antivortices trapped in the transition regions to move across the central superconducting shell region to oppositely located transition regions. In this manner, vortices and antivortices are removed from the superconducting shell walls in the central region, and the superconductor is placed in a state in which no flux quanta thread through the space internal to the central region of the superconducting shell.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

In the drawings, where like elements are referenced alike.

DETAILED DESCRIPTION OF THE DRAWING

Figure 1:
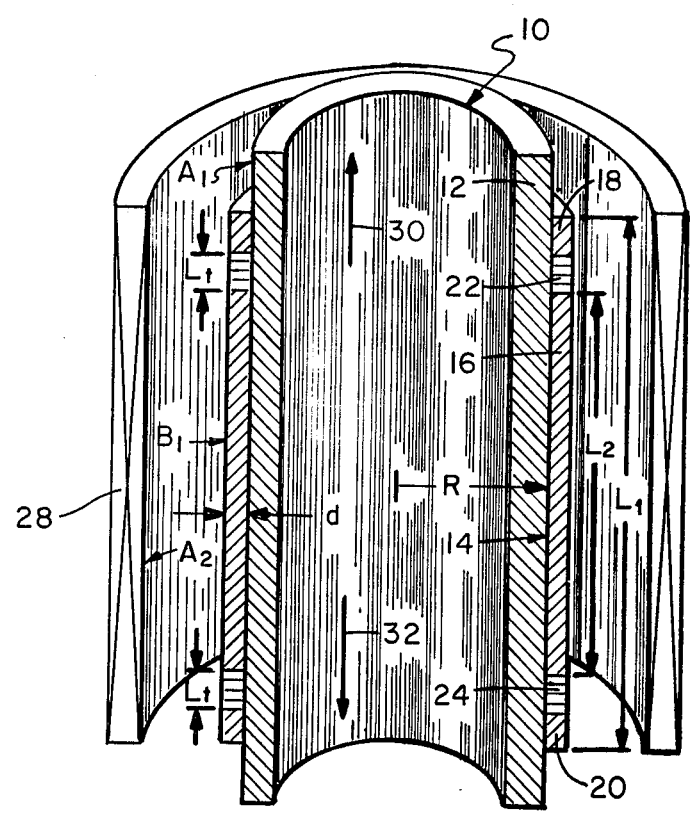
FIGS. 1-5 each show a cross-sectional view of different embodiments of the superconducting magnetic shielding arrangement of the present invention.

Referring now to FIG. 1, a generalized magnetic shield assembly 10 according to the invention is shown comprising a support element or normal metal cylinder 12 preferably formed of aluminum or the like electrical conductor. This conductor is sufficiently pure that any remnant magnetic fields produced by magnetic impurities are negligibly small. A superconducting cylindrical shell 14 surrounds and intimately contacts cylinder 12 so as to form an electrical connection therewith. In the event of an inadvertent temperature rise and a superconducting-to-normal transition of the superconducting shell 14 carrying a high current, cylinder 12 electrically protects the superconducting shell 14 by providing a shunt or alternate parallel current path until the current can be turned off. The cylinder 12 also can be formed of an insulating material, such as fused quartz, but such an insulating material does not provide automatic electrical protection for the superconducting shell 14. In such a device, additional electronic equipment is needed to detect quickly any inadvertent superconducting-to-normal transition in a current-carrying superconducting shell 14 and to turn off the current rapidly so as to avoid burnout of the shell 14. As shown in FIG. 1, shell 14 is a practical approximation of a long cylinder having an internal radius R that is much smaller than its overall length $L_1$. In FIG. 1 the dimensions, particularly the thicknesses of shell walls, in radial directions are exaggerated for clarity. Shell 14 is comprised of a central region 16 and end regions 18, 20. Transition regions 22, 24 lie between the central region 16 and end regions 18, 20, respectively. Central region 16 is made of superconducting material having a relatively low value of the critical depinning current, whereas end regions 18, 20 are made of superconducting materials having relatively high values of the critical depinning current. Transition regions 22, 24 are superconductors whose critical depinning current varies monotonically from end to end, wherein the ends of those transition regions adjacent to the central region 16 have a low value of the critical depinning current, and the ends adjacent end regions 18, 20 have a high value of critical depinning current.

Figure 2:
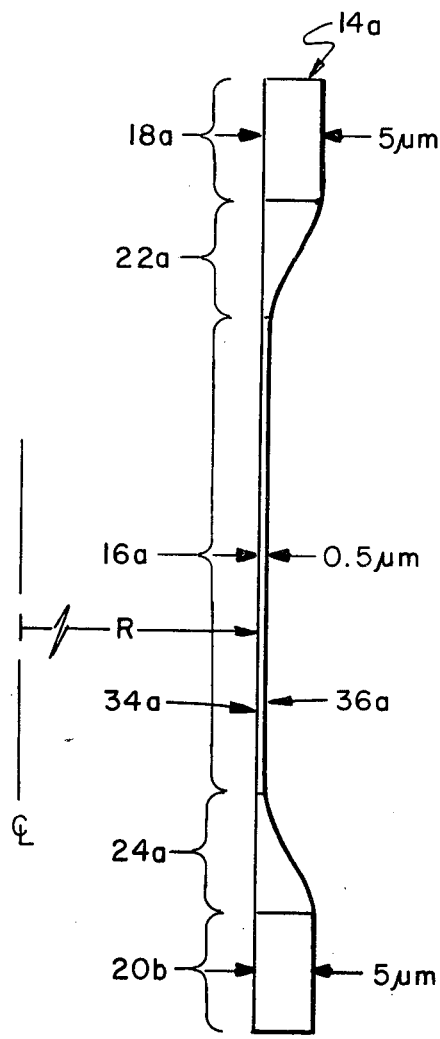

There are numerous possibilities by which the desired properties of the superconducting shell 14 could be achieved. For example, the shell could be made of niobium, and preferably have a thickness which varies along the length of the cylinder. Such an arrangement is shown in FIG. 2, wherein like elements are referenced alike, but for the addition of a suffix "a". FIG. 2 exhibits a partial longitudinal cross section of a modified shell 14a. Shell 14a has inner and outer surfaces 34a, 36a, respectively. The thickness of shell 14a, which is chosen to have a value of 0.5 $\mu$m in the central region 16a and 5 m in the end regions 18a, 20a varies smoothly between these values in the transition regions 22, 24. Since the critical depinning current density is nearly uniform throughout the niobium, the resulting critical depinning current is calculated to be about ten times larger in the end regions 18a, 20a than in the central region 16a, and varies smoothly between these limiting values in the transition regions 22a, 24a.

ALTERNATIVE MAGNETIC SHIELD ASSEMBLIES

Figure 3:
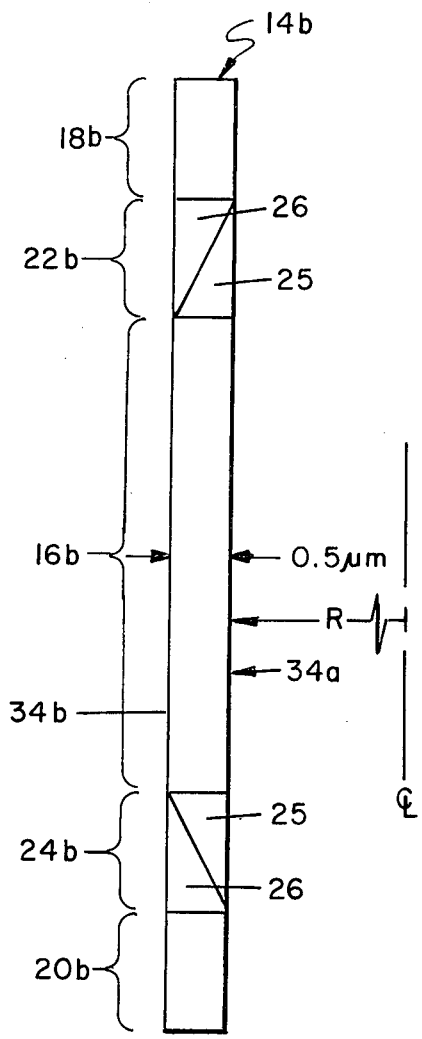

Referring now to FIG. 3, wherein like elements are referenced alike, but for the addition of a suffix "b", a partial longitudinal cross section of an alternative superconducting shell 14b, according to to the invention, is shown. Shell 14b has an inner surface 34b and an outer surface 34b. A central region 16b of shell 14b is made of niobium of uniform thickness. The end regions 18b, 20b are made of $Nb_3Sn$ (niobium-tin) of approximately the same thickness as central region 16b. The modified transition regions 22b, 24b comprise a layer 25 of niobium and a layer 26 of $Nb_3Sn$, where the total thickness of the joined layers 25, 26 remain approximately constant along the length of the transition region throughout the transition region, the $Nb_3Sn$ thickness varies smoothly from its maximum value adjacent to an end region to zero adjacent to the central region, and the niobium thickness varies smoothly from its maximum value adjacent to the central region to zero adjacent to an end region. Because the critical depinning current density of $Nb_3Sn$ is typically a factor of ten larger than that of niobium, this arrangement will produce the desired critical depinning current profile.

One method of constructing this arrangement includes processing a copper cylindrical shell having regions of varying tin concentrations, with the highest concentration in the end regions, and decreasing concentration in the end regions, with practically no tin in the central region. A niobium layer of uniform thickness, typically 0.5 $\mu$m, is deposited on the copper cylindrical shell. The arrangement is then reacted at a temperature of about 750° C., such that the tin atoms diffuse into the niobium layer causing it to convert entirely into $Nb_3Sn$ in the end regions 18b, 20b. A similar process also occurs in the transition regions 22b, 24b except that here only a fraction of the niobium is converted to $Nb_3Sn$, the fraction decreasing smoothly from a relatively high value adjacent the end regions, to zero adjacent the central region.

For each centimeter of circumferential path length around either cylindrical shell described above, the critical depinning currents at a temperature of 4.2 K. are typically $10^2$ amperes for the central region and $10^3$ amperes for the end regions, with the transition regions varying monotonically end-to-end from $10^2$ to $10^3$ amperes.

To achieve the desired final state of the magnetic shield (in which no flux quanta thread through either the interior or the walls of the central region), the magnetic flux initially trapped in the superconducting shell walls during cooldown through the superconducting transition temperature, must be in the form of singly quantized flux quanta $\phi_0$ of size $2.07 \times 10^{-7}$ gauss-cm$^2$. This requirement dictates that, among the many known superconducting materials that could be selected for fabrication of a shield according to the invention, one should select either a type-II superconductor, in which magnetic flux is always in the form of singly quantized flux quanta, or a type-I superconductor of thickness less than the critical thickness. Magnetic flux enters a thick type-I superconductor in the form of large multiply quantized domains. However, if the superconductor is thinner than the critical thickness characteristic of the material, then magnetic flux enters the superconductor in the form of singly quantized flux quanta.

The above arrangements provide a superconducting cylindrical shell having a central region in which trapped flux can be readily removed, while preventing nucleation of new magnetic flux quanta at the cylinder ends as well as any inward migration of flux quanta from the cylinder ends into the central region. Further, a reservoir of vortices and antivortices is provided by the transition regions which are located between the low-pinning central region, and the high-pinning end regions of the shell.

Figure 4:
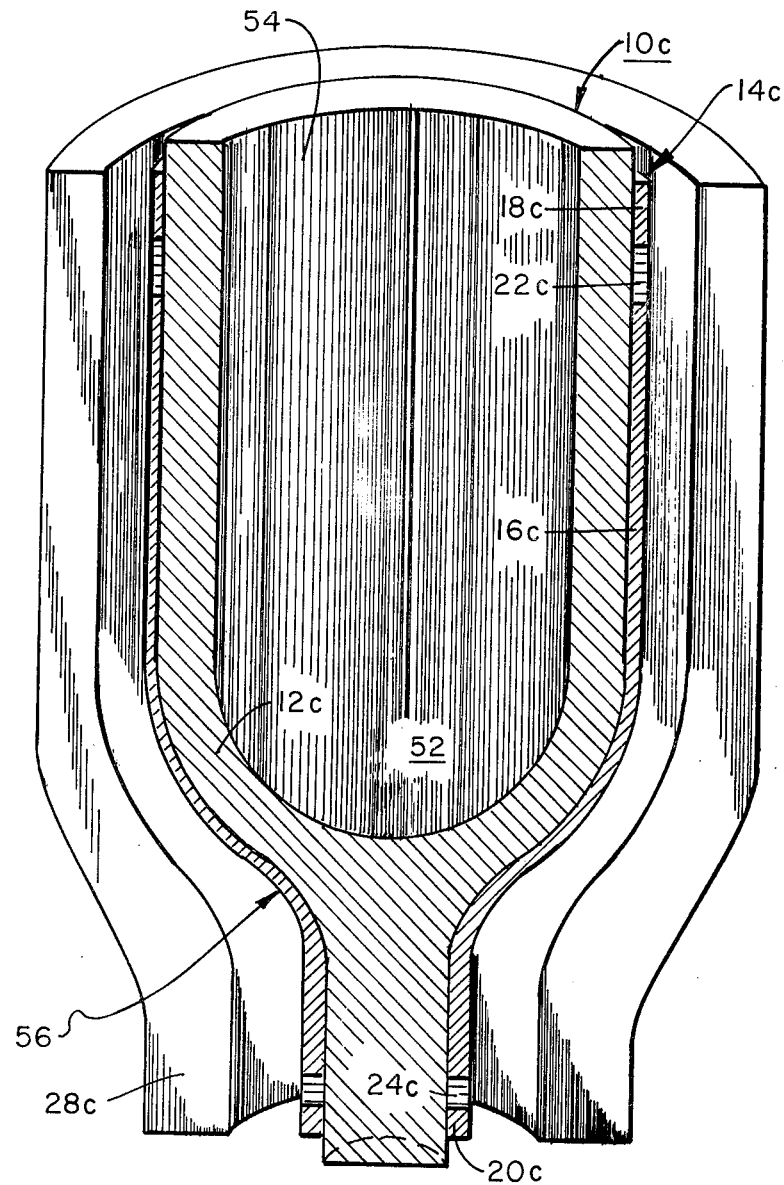
Figure 5:
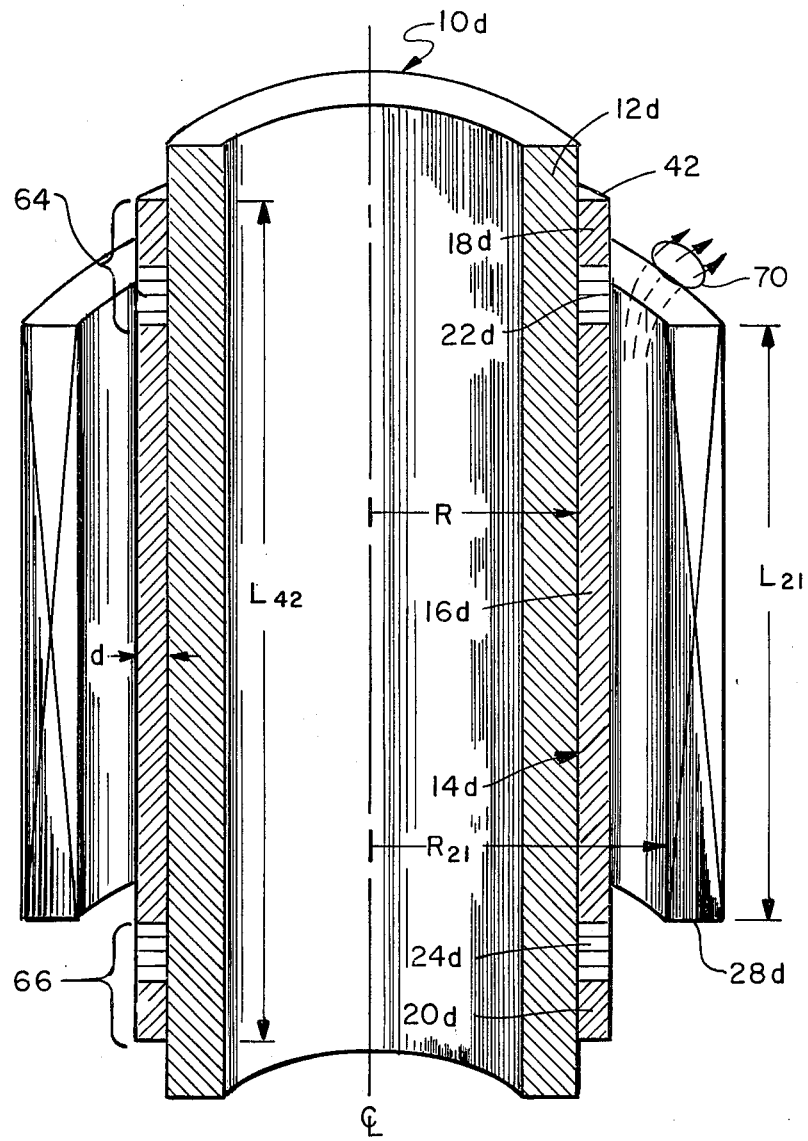

FIGS. 4 and 5 show alternative constructions of the magnetic shield assembly according to the invention wherein like elements are referenced alike, but for the addition of suffixes "c" and "d", respectively. Referring now to FIG. 4, a magnetic shield assembly 10c is illustrated in a compact arrangement having about half the length of the arrangement of FIG. 1. The radial dimensions in FIG. 4 are exaggerated for clarity. In this embodiment of the invention, super-conducting shell 14c, cylinder 12c, and solenoid 28c are necked down at one end. The low-field working volume of this arrangement, designated by the numeral 52, is accessed through the wide end 54 of cylinder 12c. Since ambient magnetic fields are more rapidly attenuated in the necked-down portion of the shield assembly, the necked-down portion 56 of shield 10c can be much shorter than the wide portion, thereby reducing the overall length of the magnetic shield. Care must be taken to shape the thickness of central region 16c of shell 14c to vary inversely as its inner radius, such that for a given longitudinal current through the central region 16c the current density remains constant. Further, the central region 16c should be shaped so that its radius and thickness vary smoothly along the length of the cylinder. Otherwise, increased pinning of flux quanta will occur at points where the radius and thickness have discontinuities. In addition, the solenoid 28c should be designed to generate parallel to the superconducting shell 14c a magnetic field that is proportional to the local thickness of shell 14c, so that the azimuthal current density reduced during the solenoid field manipulation step is constant along the length of shell 14c.

Referring now to FIG. 5, an alternative magnetic shield assembly 10d is shown comprising superconducting shell 14d, a cylinder 12d, and coaxial solenoid 28d. The radial dimensions in FIG. 5 are exaggerated for clarity. Before current is applied to the solenoid 28d, the superconducting cylindrical shell 14d is arranged to have uniform magnetic pinning properties, i.e., uniform critical depinning current, throughout its length. In this arrangement, solenoid 28d has length $L_{21}$ and an inner radius $R_{21}$. Shell 14d has a length $L_{42}$ substantially longer than the length $L_{21}$ of solenoid 28d. Portions 64, 66 of shell 14d extend beyond solenoid 28. When shell 14d is simultaneously subjected to both a longitudinal current and the magnetic field of solenoid 28d, the net induced current density is largest in the central portion 16d of shell 14d. The length of central portion 16d is $L_{21}$, coextensive with solenoid 28d. The net induced current is smaller in adjacent portions 22d, 24d, of shell 14d and still smaller in end portions 18d, 20d of shell 14d, because the magnetic field produced by solenoid 28d is weaker at the ends 64, 66 of shell 14d, as indicated by the dashed magnetic field lines 70 of FIG. 5. Vortices and antivortices are therefor most easily depinned in central region 16d of shell 14d, less easily depinned in transition regions 22d, 24d and least easily depinned in end regions 18d, 20d.

The arrangement of FIG. 5 would work in a fashion very similar to that of FIG. 1, with a few differences. The cool-down step is essentially the same as before, and two solenoid field coils referred to above would probably be needed. During the current-reduced annihilation step, however, the solenoid field would have to be energized. Otherwise, the critical depinning current would simultaneously be reached everywhere along the length of the superconducting cylinder 14d and the described reservoirs of antivortices and vortices in the transition regions 22d, 24d would be destroyed by annihilation. With the solenoid field energized, however, the vector sum of the induced current density produced via the solenoid and the applied longitudinal current density could exceed the critical depinning value in the central region, but not in the transition and end regions. In this mode of operation, the vortices and antivortices would move along helical paths, with vortices moving in one direction and antivortices moving in the opposite direction. Annihilation would occur as before, so that all vortices and antivortices could be cleared from the central region 16d of shell 14d. The solenoid field manipulation step could be carried out as set forth above with reference to FIG. 1, but use of both of the longitudinal current and the solenoid field would more readily induce vortex and antivortex motion.

The advantage of the arrangement of FIG. 5 is realized in the relative ease in making the superconducting shield, since the shield conveniently comprises a uniform layer of superconductor on a normal metal cylinder. The thickness "d" of shell 14d still would have to be less than $d_{max}$ given by Equation (1), and larger than whatever minimum thickness is required to give the desired shielding according to Equation (3). The disadvantage is that one would have to be much more careful in adjusting to small values $H_{\parallel}{}^{top}$ and $H_{\parallel}{}^{bot}$, as well as being more careful in adjusting the applied current and magnetic field during the current-induced annihilation step and the solenoid field manipulation step.

The magnetic shield arrangements described above employed right circular cylinders. However, according to the invention, other hollow elongated shapes could be employed, and are intended to be covered under a generic use of the term "cylinder". For example, the hollow elongated shape, or cylinder, of the magnetic shield could have an elliptical crosssection. In such an arrangement however, the magnetic fields of the solenoid would have to be arranged to accommodate the assymetric geometry of the elliptical cylinder.

COOLDOWN STEP

Having described the construction of the superconducting shell according to the invention, a method of reducing the magnetic field within the shell will now be described.

The superconducting cylindrical shell 14 is cooled down through its superconducting transition temperature in the presence of an ambient magnetic field $\vec{H}$, the primary source of which is the earth's magnetic field, whose magnitude is of the order of 1 gauss. It may be convenient, however, to use the superconducting shell in conjunction with a conventional mu-metal shield, in which case the magnitude of the magnetic field $\vec{H}$ is of the order of $10^{-3}$ gauss. The magnitudes of the components of the magnetic field H parallel and perpendicular to the longitudinal axis of the superconducting shell are denoted by $H_\parallel$ and $H_\perp$, respectively. Following cooldown, the magnetic field $\vec{H}$ is trapped in the form of a distribution of both vortices and antivortices in the superconducting shell wall, as well as a number of longitudinal magnetic flux quanta (each carrying magnetic flux $\phi_0 = 2.07 \times 10^{-7}$ gauss-cm$^2$) threading the interior of the central region of the cylindrical shell. During cooldown, the values of $H_\parallel$ averaged over the top and bottom of the central region 16 ($H_\parallel^{top}$ and $H_\parallel^{bot}$, respectively) should be much smaller than the corresponding values of $H_\perp$ ($H_\perp^{top}$ and $H_\perp^{bot}$, respectively). In particular, the ratios $H_\parallel^{top}/H_\perp^{top}$ and $H_\parallel^{bot}/H_\perp^{bot}$ must obey the inequality $$H_\parallel/H_\perp < 0.64 \, fL_t/R, \qquad (2)$$

where f is the fraction of vortices or antivortices, trapped in either transition region, that can be conveniently depinned and moved to the opposite end of the central region during the solenoid field manipulation step, (which will be described later). A typical value of f is 0.1. The symbol $L_t$ denotes the length of either transition region, and R denotes the inner radius of the superconducting shell. The above inequality (2) guarantees that, after the current-induced annihilation step, there will be a sufficiently large reservoir of readily movable vortices or antivortices in the transition regions to cancel the trapped longitudinal magnetic flux quanta during the solenoid field manipullation step.

In order to make both $H_\parallel^{top}$ and $H_\parallel^{bot}$ sufficiently small so that the above inequality (2) will be satisfied, two coaxial solenoid field coils (not shown in the figures) are arranged to surround the top and bottom of the central region of shell 14.

CURRENT-INDUCED ANNIHILATION STEP

Referring now to FIG. 1, symmetrical electrical conductors (not shown in the figure) are connected to both ends of the superconducting shell 14, and an electrical direct current is applied to the shell so as to travel through the longitudinal extent thereof. The magnitude of the applied current is set sufficiently large such that the electrical current in the central low pinning region 16 is slightly larger than the critical depinning current there. On the other hand, this current should not exceed the critical depinning current of either the end regions or any appreciable portion of the transition regions. All magnetic flux quanta trapped in the central region 16 are driven into circumferential motion around the central region 16 of shell 14, at speeds typically exceeding 1 cm/sec. The depinned flux quanta will move in nearly circular paths around the perimeter of region 16, with vortices moving in one direction and and antivortices moving in the opposite direction. During this step, nearly all the vortices will annihilate with antivortices (both of which are present in equal number) thereby leaving the central region 16 of shell 14 nearly free of trapped magnetic flux quanta. After about a ten second duration, the current is turned off.

It is important to note that during this step, the self magnetic field generated at the outer surface of the central region 16 of the superconducting shell is always maintained less than either the lower critical field $H_{cl}$ of the superconductor (if shell 14 is a type-II superconductor) or the bulk thermodynamic critical field $H_c$ (if shell 14 is a type-I superconductor). Otherwise, new magnetic flux quanta can nucleate at the surface of shell 14 and penetrate into the interior of the magnetic shield assembly 10. For example, the self field at the surface generated by a current of average density $2 \times 10^6$ amperes/cm$^2$ through a central region of thickness 0.5 $\mu$m (which corresponds to $10^2$ amperes per cm of perimeter of region 16) is 126 gauss, which is less than one-tenth the value of the lower critical field $H_{cl} = 1.4 \times 10^3$ gauss of pure niobium (a type-II superconductor) at a temperature of 4.2 K.

This limitation on the magnetic field during the current-induced annihilation step is also reflected in the construction of shell 14. The thickness of shell 14 must be limited so that both the self magnetic field generated at the outer surface of the superconducting shell 14 during the current-induced annihilation step, and the magnetic field applied to this surface during the solenoid field manipulation step (to be described later) are always less than either the lower critical field $H_{cl}$ of a type-II superconductor or the bulk thermodynamic critical field $H_c$ of a type-I superconductor. The maximum thickness allowing successful operation of the shield is:

$$d_{max} = 8.0 \, \mu m (\tilde{H}_{max}/\tilde{J}_c), \qquad (1)$$

where $\tilde{H}_{max}$ is the largest permissible field at the surface ($H_{cl}$ or $H_c$), expressed in units of $10^3$ gauss, and $\tilde{J}_c$ is the current density required to depin the most rigidly pinned vortex or antivortex, expressed in units of $10^6$ amperes/cm$^2$. By way of example, for pure niobium at a temperature of 4.2 K, $H_{cl} = 1.4 \times 10^3$ gauss and the critical depinning current density is expected to be less than $2 \times 10^6$ amperes/cm$^2$. Thus, $\tilde{H}_{max} = 1.4$, $\tilde{J}_c = 2$, and from Eq. (1) $d_{max} = 5.6 \, \mu m$ for this example. If equation (1) is to be satisfied, it is essential that there be no pinholes or the like defects in the central superconductor region 16. Defects of this type would greatly increase the critical depinning current for those vortices and antivortices trapped in the defects.

SOLENOID FIELD MANIPULATION STEP

At the end of the current-induced annihilation step, it is possible that there remain a few vortex and antivortex paths which do not intersect with each other and consequently are not annihilated. Further reduction of the magnetic field remaining within central region 16 is achieved through use of a coaxial solenoid 28 which surrounds superconducting shell 14. The length of solenoid 28 is not critical, but must be slightly longer than central region 16 so as to avoid fringe effects, i.e. nonuniform distribution of lines of magnetic force, in that region. At this point, the coaxial solenoid 28 is energized, causing a longitudinally directed magnetic field to be set up external and parallel to the cylindrical shell 14. As a consequence of the Meissner effect, circumferentially directed (azimuthal) currents will be induced in the super-conducting cylindrical shell 14. The magnetic field applied to region 16 is held constant and uniform, so that induced currents in that region are uniform. The ampereturns of the solenoid are chosen such that the induced current in the superconducting shell 14 is slightly larger than the critical depinning current in the central low pinning region 16. On the other hand, the induced current should not exceed the critical depinning current of either the end regions or any appreciable portion of the transition regions. The longitudinally directed magnetic field, while leaving largely unaffected the vortices and antivortices trapped in the end regions and transition regions, will cause any vortices and antivortices remaining in the central low-pinning region to move to opposite ends of that region. After about a 60-second duration, the solenoid current is turned off.

It is important to note that during this step, the field applied via solenoid 28 to the outer surface of central region 16 of the superconducting shell is always maintained less than $H_{c1}$ or $H_c$. Otherwise, new magnetic flux quanta can nucleate at the surface and penetrate into the interior of the magnetic shield arrangement 10. By way of example, applying a field of 126 gauss to the outer surface of a central region of thickness of 0.5 μm induced an azimuthal average current density of $2 \times 10^6$ amperes/cm² (or a current of $10^2$ amperes per cm of cylinder length). This field is less than one-tenth the value of the lower critical field $H_{c1} = 1.4 \times 10^3$ gauss of pure niobium at 4.2 K.

In order to assess the need for further iterations of the above-described procedure, the magnitude and direction of the longitudinally oriented remnant magnetic field of shell 14 is monitored with a magnetic flux detector which is sensitive down to the level of a single flux quantum, $\Phi_0 = 2.07 \times 10^{-7}$ gauss-cm². For example, a SQUID (superconducting quantum interference device) detector, connected to a superconducting coil capable of being rotated 180°, is suitable for this measurement. After a single application of the solenoid field, it is probable that the magnetic field measured will exceed a calculated theoretical minimum field based on the assumption that no longitudinal flux quanta are trapped within the central region 16. Because the combination of the current-induced annihilation step and the first application of the solendoi field removes all vortices and antivortices from the wall portions of shell 14 located in the central region 16, the magnetic field remaining within the enclosed volume of region 16 has a negligibly small component perpendicular to the cylinder axis. The value of the component of the magnetic flux directed upward along the cylinder axis, however, is equal to the product of $\Phi_0$, (the quantum of magnetic flux) and the net number of upwardly directed flux quanta that thread the volume enclosed within central region 16. The number of flux quanta threading this volume now can be reduced to zero by moving an appropriate number of vortices or antivortices out of storage in a transition region at one end of central region 16 to the transition region at the opposite end of central region 16. The net number of flux quanta threading the volume enclosed within central region 16 and extending in the direction of arrow 30, increases by one each time a single vortex moves from transition region 24 to transition region 22, or when a single antivortex moves from transition region 22 to transition region 24. Such motions of vortices or antivortices can be caused by applying a longitudinal solenoid field (having a direction indicated by arrow 30, FIG. 1) of such a magnitude that the induced azimuthal current exceeds the depinning critical current in the transition regions. Similarly, the net number of flux quanta threading the volume enclosed within central region 16 decreases by one each time a single vortex moves from transition region 22 to transition region 24, or when a single antivortex moves from transition region 24 to transition region 22. Such motions of vortices or antivortices can be caused by applying a solenoid field (of direction indicated by arrow 32, FIG. 1) of such a magnitude that the induced azimuthal current exceeds the depinning critical current in the transition regions.

An iteration of the solenoid field manipulation step is now carried out, with the magnitude and direction of the applied solenoid field so chosen that the number of depinned vortices or antivortices, and their direction of motion, will lead to a reduction in the number of flux quanta threading the hole. At the end of this iteration, the magnitude and direction of the remaining magnetic flux is again measured, and the need for an additional iteration is assessed. Such iterations are repeated until the number of longitudinal flux quanta threading the interior of region 16 is reduced to zero.

To reduce the time required for iterating toward the desired zero-quantum state of the central region, it may be found convenient to simultaneously monitor the longitudinal magnetic flux while the solenoid field values are changed. It is further possible to use feedback circuitry to accomplish the zero-quantum state automatically during the solenoid field manipulation step. In addition, to more readily induce vortex and antivortex motion, it may be convenient to apply a longitudinal current during the solenoid field manipulation step iterations.

When the number of longitudinal magnetic flux quanta trapped in the interior of central region 16 has been reduced to zero, the remaining magnetic field component $H_{i\parallel}$, extending along the axis of shell 14, will approach the following theoretically calculated value:

$$H_{i\parallel} = H_{a\parallel}(2\lambda/R)e^{-d/\lambda}, \qquad (3)$$

where $H_a \parallel$ is the parallel component of the magnetic field applied to the outside of the shell, $\lambda$ is the weak-field penetration depth appropriate to the superconductor used, R is the inner radius of the central region, and d is the superconductor wall thickness of the central region 16. If a single mu-metal shield is used, $H_a \parallel$ is typically $2 \times 10^{-3}$ gauss. For example, for a niobium shield with $\lambda = 500$ Å, R = 2.5 cm, and d = 5000 Å, the resulting value of the internal parallel field is, from Eq. (3), $H_i \parallel = 4 \times 10^{-13}$ gauss.

The remaining magnetic field perpendicular to the axis of shell 14 and internal to central region 16, can be estimated from the following theoretical expression:

$$H_{i\perp} = 1.32 H_{a\perp} e^{-0.92 L_1/R}, \qquad (4)$$

where $H_{a\perp}$ is the perpendicular component of the applied magnetic field that is trapped in the end regions and part of the transition regions 22,24; $L_1$ is the length of the central region 16, and R is the inner radius of the central region 16. If, for example, $H_{a\perp}$ is $2 \times 10^{-3}$ gauss, $L_1 = 40$ cm, and R = 2.5 cm, the resulting value of the internal perpendicular field is from Eq. (4) $H_{i\perp} = 1.1 \times 10^{-9}$ gauss.

While cylinder 12 is shown in FIG. 1 as lying within superconducting shell 14, cylinder 12 could also lie outside shell 14, or even comprise nested coextensive cylinders between which shell 14 is inserted. In either arrangement, cylinder 12 provides the mechanical support for superconducting shell 14.

The embodiments of the invention in which an exclusive property or privilege is claimed are defined as follows:

1. An apparatus for providing a magnetic shield around a working volume, comprising:
   (a) first cylinder of superconducting material surrounding said working volume, said first cylinder having an axis, a circumference, a central portion of predetermined magnetic pinning properties, end portions of higher magnetic pinning properties, and transition regions interposed between said central and said end portions, said transition regions having a predetermined length and magnetic pinning properties which vary monotonically along the length of said transition regions:
   (b) first current means for generating circumferentially-directed currents in said first cylinder; and
   (c) second current means for generating axially-directed currents in said first cylinder.

2. The apparatus of claim 1 wherein said first current means comprise electrical solenoid means magnetically coupled to said transition regions of said first cylinder.

3. The apparatus of claim 1 wherein said second current means comprise means for connecting end portions of said first cylinder to a first external electrical circuit.

4. The apparatus of claim 1 wherein said second current means comprise a second electrically conductive cylinder disposed within said first cylinder in electrical connection therewith.

5. The apparatus of claim 4 wherein said second current means comprise means for electrically connecting a first and a second end portion of said second electrically conductive cylinder to a first external electrical circuit.

6. The apparatus of claim 1 wherein said central portion of said first cylinder has a predetermined critical magnetic depinning current, and said first curremt means generates a current exceeding said critical magnetic depinning current.

7. The apparatus of claim 6 wherein said second current means generates a current which exceeds said predetermined critical magnetic depinning current.

8. The apparatus of claim 1 further including means for reversing the direction of current flow of said first current means.

9. The apparatus of claim 1 further including means for reversing the direction of current flow of said second current means.

10. The apparatus of claim 1 wherein said transition regions comprise overlapping first and second layers of varying thickness magnetic pinning materials, said materials having different magnetic pinning properties.

11. The arrangement of claim 1 wherein said transition regions comprise a transition material having substantially uniform magnetic pinning properties and a varying thickness throughout its length.

12. The arrangement of claim 4 wherein said first and said second cylinders each have first and second ends of reduced and enlarged circumferential dimensions, respectively.

13. A method for providing an ultra-low magnetic field in a superconducting shield apparatus which comprises a first cylinder of superconducting material having an axis, a circumference, a central portion of predetermined magnetic pinning properties, end portions of higher magnetic pinning properties, and transition regions interposed between said central and said end portions, said transition regions having a predetermined length and magnetic pinning properties which vary monotonically along the length of said transition regions, the method comprising the steps of:
   (a) passing an axially-directed current through said first cylinder so as to depin and mutually annihilate magnetic vortices and antivortices trapped in said central portion of said first cylinder;
   (b) passing circumferentially-directed current through said central region of said first cylinder so as to depin magnetic vortices and antivortices trapped in said cylinder; and
   (c) moving said depinned vortices and antivortices in opposing axial directions so as to cause mutual annihilation of said vortices and antivortices.

14. The method of claim 13 wherein said step of passing an axially-directed current in said first cylinder comprises the step of passing an electrical current through a second electrically conductive cylinder which is disposed within and coextensive with said first cylinder, so as to be in electrical connection therewith.

15. The method of claim 13 wherein the steps of passing circumferentially-directing currents through said first cylinder comprises the step of energizing a coaxial solenoid which is substantially coextensive with and surrounds said first cylinder, so as to be set up an axially-directed magnetic field therethrough.

16. The method of claim 13 further including the step of altering the first current means so as to reverse the direction of flow of said circumferentially-directed currents.

17. The method of claim 16 further including the step of altering said second current means so as to reverse the direction of flow of said axially-directed currents in said first cylinder.

18. The method of claim 17 further including a repetition of the steps of reversing the direction of flow of longitudinal and circumferentially-directed currents so as to depin vortices and antivortices in said transition regions of said cylinder, and so as to depin any remaining vortices and antivortices trapped in said central portion of said first cylinder, until the number of longitudinal flux quanta threading through the interior of the first cylinder is reduced to zero and said central portion of said first cylinder is rendered free of trapped vortices and antivortices.

19. The method of claim 13 further including the step of cooling said first cylinder in the presence of an external axially-directed magnetic field so as to cancel axially-directed magnetic flux threading through ends of said central region of said first cylinder, and so as to create reservoirs of vortices and antivortices in said transition regions of said first cylinder.

* * * * *